(12) United States Patent
Stockinger (10) Patent No.: US 9,236,372 B2
(45) Date of Patent: Jan. 12, 2016

(54) COMBINED OUTPUT BUFFER AND ESD DIODE DEVICE

(75) Inventor: Michael A. Stockinger, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 160 days.

(21) Appl. No.: 13/193,855

(22) Filed: Jul. 29, 2011

(65) Prior Publication Data
US 2013/0026576 A1 Jan. 31, 2013

(51) Int. Cl.
*H01L 29/06* (2006.01)
*H01L 27/02* (2006.01)

(52) U.S. Cl.
CPC .................................. *H01L 27/0255* (2013.01)

(58) Field of Classification Search
CPC ............ H01L 27/0266; H01L 27/0255; H01L 27/0277
USPC .................................. 257/491, 492, 493, 494
See application file for complete search history.

(56) References Cited

U.S. PATENT DOCUMENTS

| | | | |
|---|---|---|---|
| 5,811,857 A | 9/1998 | Assaderaghi et al. | |
| 5,874,763 A * | 2/1999 | Ham | 257/360 |
| 6,075,686 A | 6/2000 | Ker | |
| 6,083,784 A * | 7/2000 | Hirade | 438/231 |
| 6,118,155 A | 9/2000 | Voldman | |
| 6,559,508 B1 * | 5/2003 | Lin et al. | 257/360 |
| 6,657,241 B1 | 12/2003 | Rouse et al. | |
| 6,794,715 B1 * | 9/2004 | Liu | H01L 27/0277 257/346 |
| 2002/0149059 A1 | 10/2002 | Ker et al. | |
| 2004/0051146 A1 * | 3/2004 | Ker et al. | 257/360 |
| 2005/0045954 A1 * | 3/2005 | Kao | 257/355 |
| 2005/0099369 A1 * | 5/2005 | Lee | 345/76 |
| 2006/0028776 A1 | 2/2006 | Stockinger et al. | |
| 2008/0315315 A1 | 12/2008 | Mathew et al. | |
| 2009/0067104 A1 | 3/2009 | Stockinger et al. | |

FOREIGN PATENT DOCUMENTS

| | | |
|---|---|---|
| WO | 9622613 A1 | 7/1996 |
| WO | 2007043319 A1 | 4/2007 |

OTHER PUBLICATIONS

M. Stockinger et al., CDM Protection Design for CMOS Applications Using RC-Triggered Rail Clamps, EOS/ESD Symposium, 2009.

(Continued)

*Primary Examiner* — Jerome Jackson, Jr.
*Assistant Examiner* — David Chen
(74) *Attorney, Agent, or Firm* — Terrile, Cannatti, Chambers & Holland, LLP; Michael Rocco Cannatti (57) ABSTRACT

An integrated circuit ESD protection circuit (270) is formed with a combination device consisting of a gated diode (271) and an output buffer MOSFET (272) where the body tie fingers of a first conductivity type (307) are formed in the substrate (301, 302) and isolated from the drain regions of a second conductivity type (310) using a plurality of diode poly fingers (231, 232) which are interleaved with a plurality of poly gate fingers (204, 205) forming the output buffer MOSFET (272).

17 Claims, 6 Drawing Sheets

FIG. 5

(56) References Cited

OTHER PUBLICATIONS

M. Stockinger, Characterization and Modeling of Three CMOS Diode Structures in the CDM to HBM Timeframe, EOS/ESD Symposium, 2006.

S. Voldman et al., Semiconductor Process and Structural Optimization of Shallow Trench Isolation-Defined and Polysilicon-Bound Source/Drain Diodes for ESD Networks, EOS/ESD Symposium 98-151, 1998.

* cited by examiner

COMBINED OUTPUT BUFFER AND ESD DIODE DEVICE

BACKGROUND OF THE INVENTION

1. Field of the Invention

The present invention is directed in general to integrated circuit electrostatic discharge (ESD) protection devices and methods for operating same. In one aspect, the present invention relates to an ESD protection circuit that uses output transistors and diodes as ESD protection devices.

2. Description of the Related Art

An integrated circuit (IC) may be subject to an ESD event in the manufacturing process, during assembly and testing, or in the system application. Some on-chip ESD protection networks use an active MOSFET (metal oxide semiconductor field-effect transistor) rail clamp protection scheme with large ESD diodes between the input/output (I/O) pads and the power supply rails.

Figure 1:
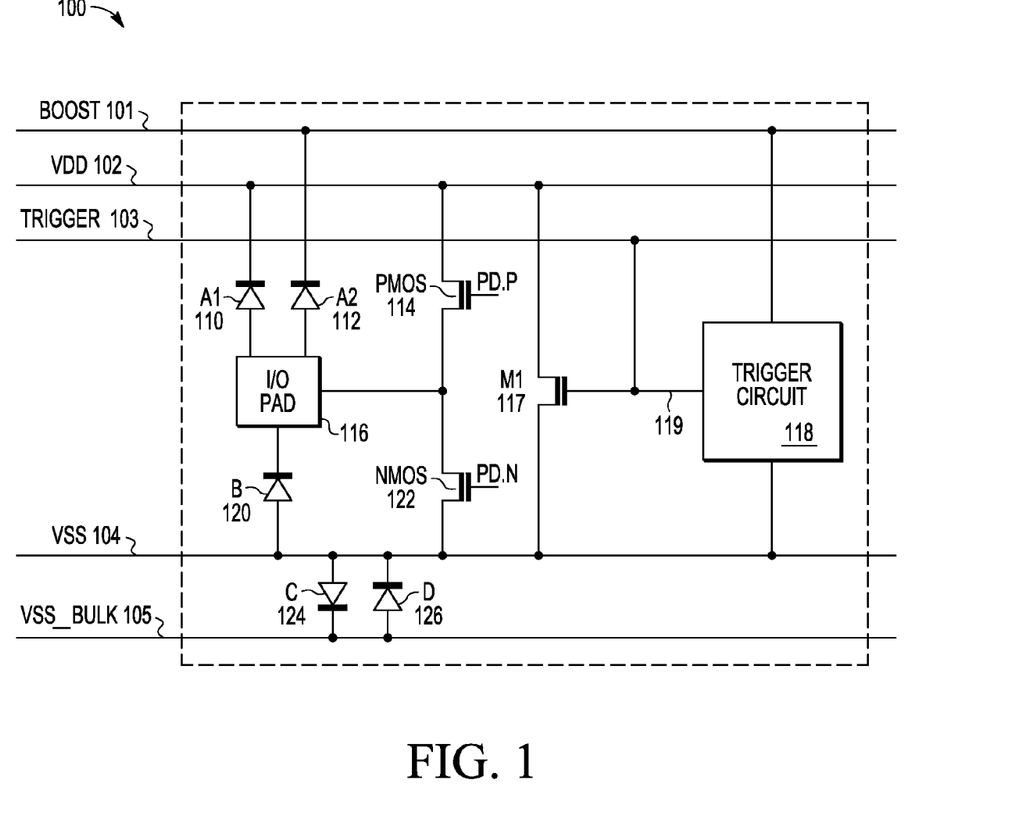
FIG. 1 illustrates a simplified circuit schematic diagram of a conventional ESD protection circuit.

FIG. 1 illustrates in schematic diagram form a conventional ESD protection circuit 100 for protecting an I/O pad 116. The ESD protection circuit 100 is connected to a boost bus 101, a first power supply VDD 102, a trigger bus 103, a second power supply VSS 104, and a third power supply VSS_BULK 105. In the ESD protection circuit 100, a rail clamp device 117 has current electrodes coupled between the VDD 102 and VSS 104. Though shown as an NMOS MOSFET transistor, the rail clamp device 117 may be of a different type, for example, a PMOS transistor, a BJT (bipolar junction transistor), an SCR (silicon-controlled rectifier), or a GGMOS (grounded gate MOS) transistor. The ESD protection circuit 100 also includes a trigger circuit 118 that is coupled between the boost bus 101 and VSS 104 for providing a trigger signal 119 to the gate of the rail clamp transistor device 117. Other clamp trigger signals can also be provided on the trigger buss 103. As depicted, a first diode 110 is coupled between VDD 102 and the I/O pad 116, a second diode 112 is coupled between the boost bus 101 and the I/O pad 116, and a third diode 120 is coupled between the I/O pad 116 and the VSS 104. There are also first and second diodes 124, 126 coupled between VSS and VSS_BULK in opposite directions for purposes of providing additional ESD protection to and from the semiconductor substrate. To provide ESD protection for CMOS (complementary metal oxide semiconductor) I/O circuits, the ESD protection circuit 100 also includes a PMOS (P-type metal oxide semiconductor) output buffer transistor 114 and an NMOS (N-type metal oxide semiconductor) output buffer transistor 122 coupled to drive an internally generated signal on an I/O pad 116. The gates of output buffer transistors 114, 122 receive predriver signals PD.P, PD.N, respectively.

As will be appreciated, ESD diodes 110, 120 may be sized for conducting a relatively large ESD current, where ESD diode 110 provides a high-current ESD path from the I/O pad 116 to VDD in case of a positive ESD event on the I/O pad 116, and ESD diode 120 provides a high-current ESD path from VSS to I/O pad 116 in case of a negative ESD event on the I/O pad 116. During an ESD event that requires shunting a high ESD current from VDD to the VSS by rail clamp transistor device 117 (e.g., a positive ESD zap on I/O pad 116 with respect to another I/O pad), the trigger circuit 118 provides the voltage from boost bus 101 to the gate of rail clamp transistor device 117. ESD diode 112 provides a separate current path from the I/O pad 116 via the boost bus 101 to power trigger circuit 118. Since very little current is required to power trigger circuit 118, the voltage drop across ESD diode 112 during an ESD event is much smaller than the voltage drop across diode 110. In this manner, the boost bus 101 supplies a voltage that is higher than the VDD voltage 102 through the trigger circuit 118 to the gate of rail clamp transistor device 117 during an ESD event, thereby providing increased conductivity of the rail clamp device. The boost bus 101 can be relatively narrow due to the very little current it needs to conduct.

BRIEF DESCRIPTION OF THE DRAWINGS

The present invention may be understood, and its numerous objects, features and advantages obtained, when the following detailed description is considered in conjunction with the following drawings, in which.

DETAILED DESCRIPTION

An electrostatic discharge (ESD) protection device and associated methods of operation and fabrication are described for protecting I/O pad cells of an integrated circuit, where the ESD protection device includes an output buffer transistor and gated diode combination formed compactly in the same layout area by interleaving multi-fingered gate and diode poly layers with body tie regions such that one or more diode body tie regions are isolated from the transistor drain region(s) by the interleaved diode poly layer(s) to form high performance gated diodes. In selected embodiments, the ESD protection circuit uses inherent drain-body diodes of the output buffer transistors to form ESD diodes. In other embodiments, additional body tie diffusions are formed adjacent to the source diffusions at the output buffer transistors without an isolation region (STI) between the two diffusion regions, thereby forming butted source-body tie diodes. By using inherent drain-body diodes of output buffer transistors with gated diodes as the dominant ESD diodes, higher performance ESD diodes are formed with reduced layout area requirements as compared to separately placed STI diodes. As disclosed herein, the body tie regions may be positioned in the substrate using the multi-fingered gate and diode poly layers as an implant or diffusion mask to define a repetitive insertion pattern to distribute the body tie regions uniformly over the entire MOSFET layout. In this way, selected drain regions in the active areas of the output buffer transistor are shared between the output buffer transistor and the diode, and the number/frequency of inserted diode junctions (body tie regions) depends on the required ESD diode strength versus size of the output buffer transistor, which is typically defined by the drive strength requirement of the output buffer transistor.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. In addition, although specific example materials are described herein, those skilled in the art will recognize that other materials with similar properties can be substituted without loss of function. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

Referring again to FIG. 1, ESD diodes 110, 112, 120 may be implemented with shallow trench isolation (STI) diodes formed between the heavily N-doped (N+) active and heavily P-doped (P+) active diffusion regions. While the ESD diodes 110, 120 may be formed from the drain to body (i.e. N-well or P-well tie) STI diodes inherent to output buffer transistors 114, 122, respectively, such inherent STI diodes may be too resistive to provide robust ESD protection with typical output buffer physical layouts. As a result, STI diodes 110, 120 are usually formed in separate regions from the I/O cell, requiring significant layout area in order to conduct the majority of the ESD current while minimizing their on-resistance and requiring isolating guard rings between buffers and the STI diodes. The formation of output buffers and STI diodes in separate regions also imposes metal routing and device floor-planning limitations, reduces the failure current due to higher dissipated power density on silicon, and impairs the ESD performance (low on-conductance, high turn-on delay) for STI diodes that are inherent to the buffer device. Accordingly, a need exists for an improved ESD protection device and method of operation that overcome the problems in the art, such as outlined above. Further limitations and disadvantages of conventional processes and technologies will become apparent to one of skill in the art after reviewing the remainder of the present application with reference to the drawings and detailed description contained herein.

Figure 2:
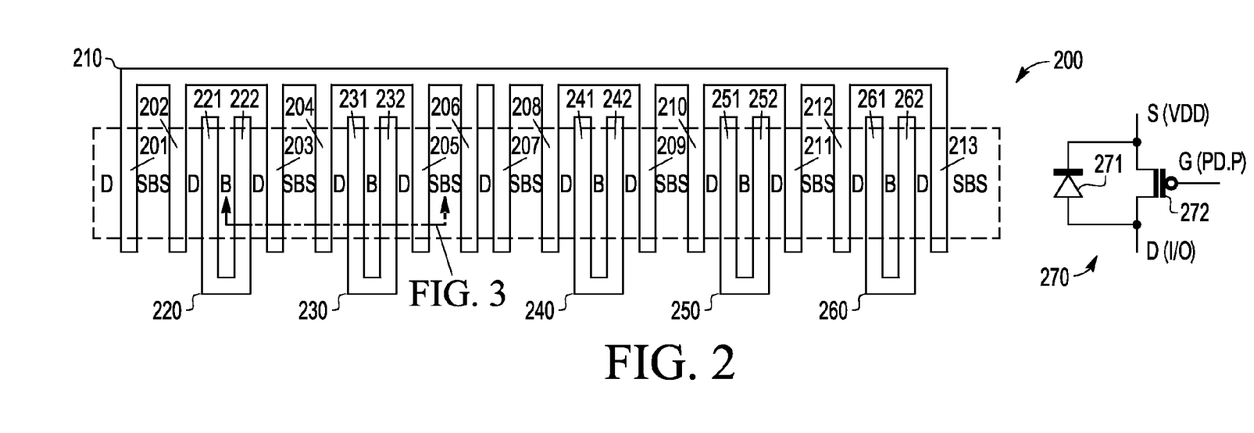
FIG. 2 shows a plan view of a PMOS-gated diode combination device formed with interleaved transistor and diode poly regions in accordance with selected embodiments of the invention.

Turning now to FIG. 2, there is depicted a plan view 200 of a PMOS-gated diode combination device, shown on the right as ESD protection device 270 formed with a gated diode 271 coupled in parallel with PMOS output buffer transistor 272 having a first current electrode coupled to the VDD, a second current electrode coupled to an I/O pad, and a control electrode for receiving a predriver signal PD.P from a predriver circuit (not shown). As shown in the plan view 200, the ESD protection device 270 is fabricated in the active semiconductor layer (enclosed by the dashed line) by forming the PMOS output buffer transistor 272 as a multi-finger MOSFET device that is laid out with alternating source (S) and drain (D) substrate regions separated from one another by a poly gate layer 210 having a plurality of gate poly fingers 201-213. In addition, the gated diode 271 is formed with a plurality of body tie substrate regions (B) that are positioned next to the drain regions and isolated therefrom by diode poly structures 220, 230, 240, 250, 260 forming diode poly fingers 221, 222, 231, 232, 241, 242, 251, 252, 261, 262 that are arranged in parallel to the gate poly fingers 201-213, thereby forming gated junctions (diodes) between the drain (D) and body (B) regions. Though not required, there may also be body tie substrate regions formed adjacent or butted to the source (S) regions that are positioned laterally from the drain regions and isolated therefrom by transistor poly layers (e.g., 201, 202), thereby forming additional butted source-body tie diodes between the body and drain of the PMOS output buffer transistor 272.

As depicted, the multi-finger gated diode 271 and MOSFET output buffer device 272 are formed within the same layout area by defining the multi-fingered transistor poly layer 210 which is interleaved with a plurality of parallel diode poly structures 220, 230, 240, 250, 260, thereby providing an area efficient output buffer transistor layout. While the depicted ESD protection device 270 includes thirteen parallel connected transistors and ten parallel connected lateral diodes, it will be appreciated that the number or frequency of inserted diode poly fingers (and associated body tie regions) relative to the number of transistor poly fingers can be adjusted, depending on the desired ESD diode strength versus size of the MOSFET. In addition, the output buffer transistor is shown as being implemented with a plurality of relatively small parallel connected transistors in a multi-finger gate poly structure 210 which is interleaved with five separate multi-finger diode poly structures 220, 230, 240, 250, 260. However, it will be appreciated that the multi-finger diode poly structures can be formed as a single multi-finger diode poly structure so long as there are no different voltage requirements for the different diode poly structures. Conversely, the multi-finger gate poly structure 210 may be implemented with a plurality of separate multi-finger gate poly structures which would e.g. allow drive strength partitioning of the MOSFET or a staggered turn-on for slew rate control by selectively driving each gate poly structure by a plurality of predriver signals PD.P. Separate multi-finger gate poly structures would also allow one or more of the gate fingers to be "optioned-out" by connecting them to VDD if not all of the available parallel transistors are required to achieve the required signal drive strength on the output pad.

Figure 3:
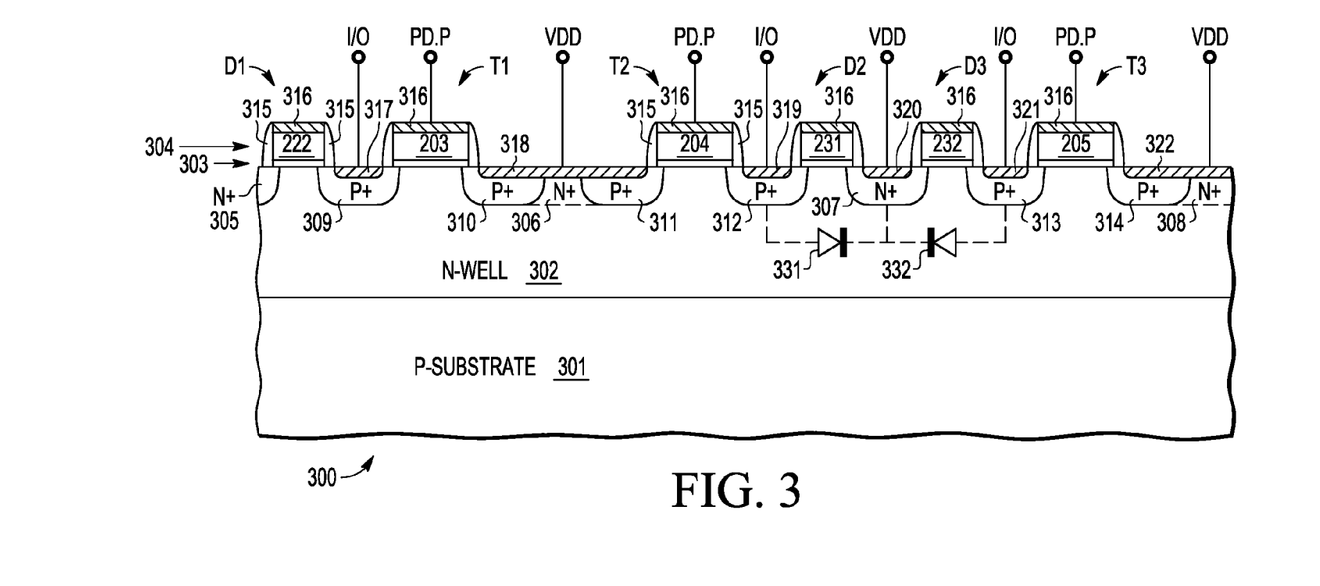
FIG. 3 shows a partial cross-sectional view of the PMOS-gated diode combination device in FIG. 2.

For additional detail, reference is now made to FIG. 3 which depicts a partial cross-sectional view of the PMOS-gated diode combination device 300 for use in the ESD protection circuit 270 shown in FIG. 2. PMOS output buffer transistor 272 is implemented as an integrated circuit formed with an n-well 302 and a p-type substrate 301, and includes a plurality of parallel-connected transistors T1, T2, T3, etc. having a corresponding plurality of gate poly fingers 203-

205. The gated diode 271 is also formed over the n-well 302 with a plurality of parallel-connected diodes (e.g., 331, 332) having a corresponding plurality of diode poly fingers 231, 232. As depicted, the gate and diode poly fingers are positioned to interleave with one another in an alternating pattern of parallel fingers with diode poly fingers laterally adjacent to gate poly fingers. In addition, the diode poly fingers may have a smaller width dimension than the gate poly fingers since the diode poly fingers do not have the same electrical performance requirements, but any desired feature width can be used for the different poly fingers.

Each gate poly finger (e.g., 203, 204, 205) defines a transistor (e.g., T1, T2, T3) having a first current electrode (e.g., P+ source region 310 and its associated silicide layer 318) coupled to VDD, a second current electrode (e.g., P+ drain region 309 and its associated silicide layer 317) coupled to an I/O pad, and a gate electrode (e.g., gate finger 203 and its associated silicide layer 316) coupled to receive predriver signal PD.P. Similarly, each diode poly finger (e.g., 222, 231, 232) defines a diode (e.g., D1, D2, D3). For example, diode poly finger 231 defines a first diode D2 331 having a first current electrode (e.g., P+ drain region 312 and its associated silicide layer 319) coupled to I/O and a second current electrode (e.g., N+ body region 307 and its associated silicide layer 320) coupled to VDD, thereby forming a P-N junction between the p-type region (e.g., P+ drain region 312) and the n-type region (e.g., the N-well 302). An additional parallel connected diode (e.g., D3 332) may be formed from the same n-type region (e.g., the N-well 302) by forming a second p-type region (e.g., P+ drain region 313) to be separated from the n-type region 307 by another diode poly finger 232, thereby defining a diode D3 332 having a first current electrode (e.g., P+ drain region 313 and its associated silicide layer 321) coupled to I/O and a second current electrode (e.g., N+ body region 307 and its associated silicide layer 320) coupled to VDD. While the diode poly fingers are shown as floating elements that are not connected to any electrode, this is not necessarily the case since the diode poly fingers could be connected to a reference voltage (e.g., VDD) or any other signal line if desired to control or alter the electrical performance of the associated diode. In selected embodiments, the p-substrate 301 is coupled to VSS_BULK 105 of FIG. 1.

The depicted PMOS-gated diode combination device 300 includes multiple body ties that connect the N-well 302 to VDD, such as the N+ diffusion regions 306, 308 that provide body ties for transistors T1-T3 and are butted to the P+ source regions 310-311, 314 and coupled to VDD by silicide layers 318, 322. These N+ diffusion regions 306, 308 define diodes (not shown) that are inherent to each of the transistors T1-T3. These diodes are formed by P-N junctions between the N+ body tie diffusion regions (e.g., 306) and N-well 302, on the one hand, and the P+ diffusion regions (e.g., 309, 312) that function as drains for each of the butted source-body tie output buffer transistors T1, T2, respectively, on the other hand. However, selected embodiments do not include the body diffusion regions 306, 308 between source regions, in which case a single source region can be shared by the transistors (e.g., T1 and T2), thereby providing a smaller layout.

FIG. 3 also shows that lateral gated diodes 331, 332 are defined with reference to the diode poly fingers (e.g., 231, 232) and illustrated with dashed lines. These gated diodes 331, 332 are formed by P-N junctions between the N+ body regions (e.g., 307) and N-well 302, on the one hand, and the P+ diffusion regions 312, 313 that function as drains for the adjacent output buffer transistors T2, T3, respectively, on the other hand. In the fabrication process, the P-N junctions for the gate diodes (e.g., 331, 332) are formed by fabricating drain and body tie "finger" regions having an opposite conductivity types and isolated from one another by diode poly fingers using a repetitive insertion pattern to distribute them uniformly over the entire MOSFET layout so that the drain regions are shared between the transistor and the diode elements. The overall drain-to-body lateral diode inherent to such a combination device forms a strong ESD diode. By way of example, diode 331 provides an ESD current path from the I/O connection (via P+ drain region 312) to VDD (via N+ body region 307), wherein the current flows through silicide layer 319 to P+ drain region 312, crosses the P-N junction formed by P+ drain region 312 and N-well 302, continues to flow in the N-well to the N+ body tie diffusion 307, and then flows through silicide layer 320 to VDD. With this discharge path, the total diode resistance is lower than would be required to penetrate deeper around an STI region.

In addition to forming an ESD protection device with a PMOS output buffer transistor as shown in FIGS. 2-3, selected embodiments of the present invention may also be implemented with NMOS output buffer transistors by forming the transistors in a p-type substrate or well region, reversing the conductivity type of the diffusion regions, and replacing VDD by VSS. To provide an example implementation, reference is now made to FIG. 4 which shows a plan view 400 of an NMOS-gated diode combination device, shown on the right as ESD protection device 450 formed with a gated diode 451 coupled in parallel with NMOS output buffer transistor 452 having a first current electrode coupled to an I/O pad, a second current electrode coupled to the VSS, and a control electrode for receiving a predriver signal PD.N from a predriver circuit (not shown). As shown in the plan view 400, the ESD protection device 450 is fabricated by forming interleaved transistor gate poly fingers 401-407 and diode poly fingers 421, 422, 431, 432, 441, 442. The multi-finger NMOSFET device 452 is laid out with alternating source (S) and drain (D) substrate regions separated from one another by a poly gate layer 410 having a plurality of gate poly fingers 401-407. In addition, the gated diode 451 is formed with a plurality of body tie substrate regions (B) that are positioned next to the drain regions and isolated therefrom by diode poly layers 420, 430, 440, thereby forming gated junctions (diodes) between the drain (D) and body (B) regions.

Figure 4:
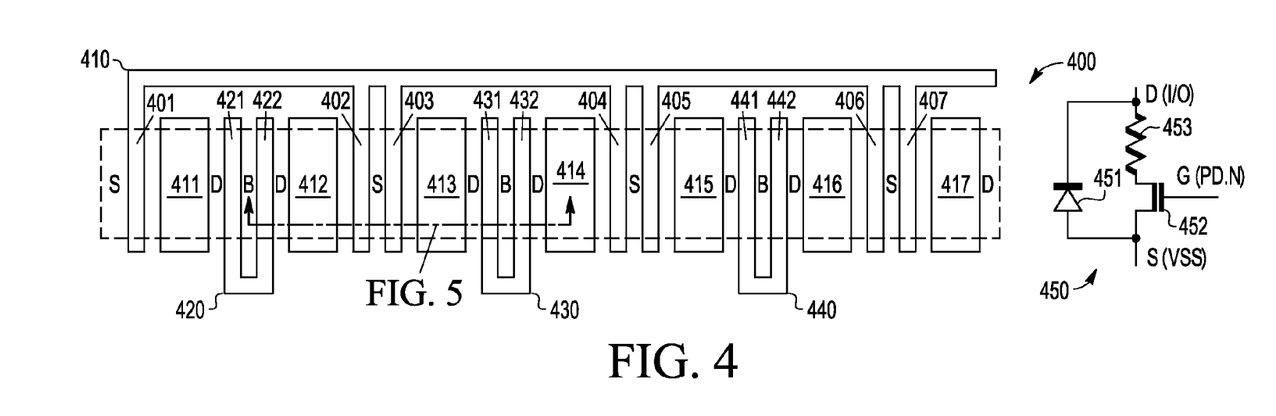
FIG. 4 shows a plan view of an NMOS-gated diode combination device formed with interleaved transistor and diode poly regions and an optional mask defining a drain-side RPO region in accordance with selected embodiments of the invention.

Though not required, the ESD protection device 450 may be fabricated to include a drain-side resistor element 453 between the NMOS output buffer transistor 452 and the I/O pad. To this end, the plan view 400 of an NMOS-gated diode combination device shows that optional mask elements 411-417 are provided to define one or more drain-side resistor-protect-oxide (RPO) regions in the substrate which are used to prevent the formation of silicide in these areas, thereby increasing their Ohmic resistance. By forming individual mask elements 411-417 over the drain side diffusion region as a pattern of interleaved mask fingers, the drain side resistor elements 453 are effectively formed between the second current electrode coupled to the I/O pad and the control electrode for receiving a predriver signal PD.N.

Figure 5:
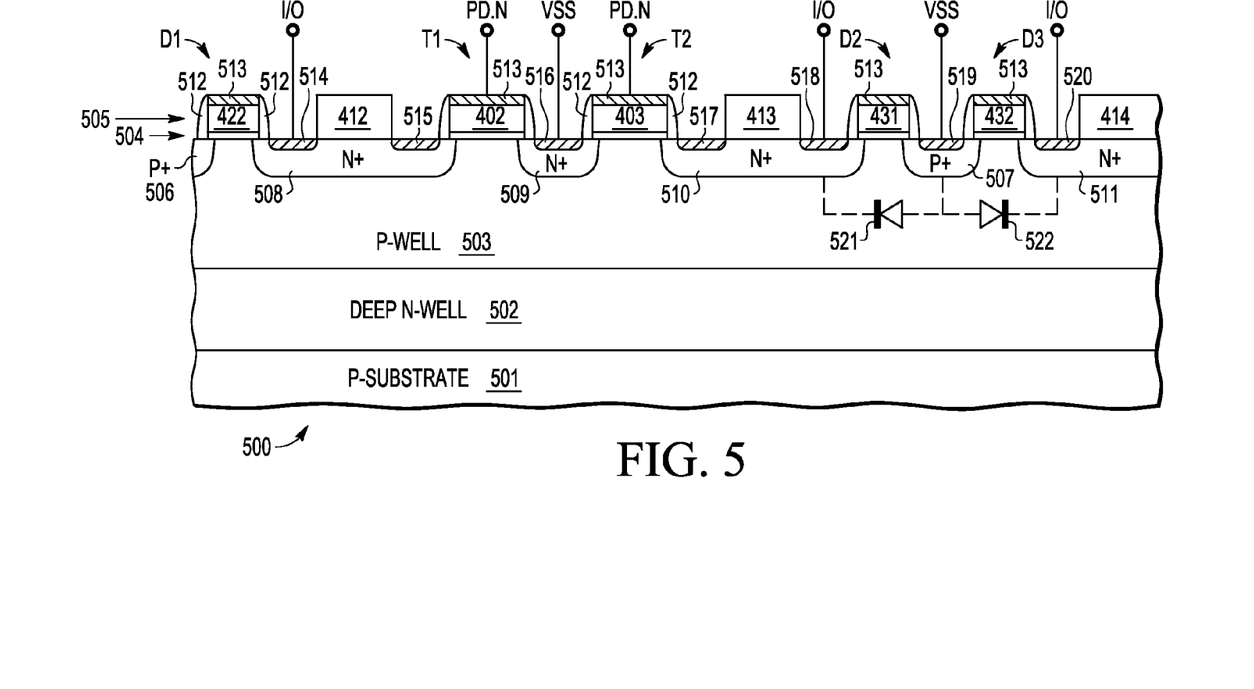
FIG. 5 shows a partial cross-sectional view of the NMOS-gated diode combination device in FIG. 4.

For additional detail, reference is now made to FIG. 5 which depicts a partial cross-sectional view of the NMOS-gated diode combination device 500 corresponding to the ESD protection circuit 450 shown in FIG. 4. In selected CMOS implementations using a common p-type substrate 501, the NMOS-gated diode combination device 500 includes an NMOS output buffer transistor 452 and gated diode 451 formed in a p-well 503, which in turn is located above a deep n-well 502 formed in the p-type substrate 501. In selected embodiments, the p-substrate 501 is coupled to VSS_BULK 105 of FIG. 1. In addition, the p-well 503 may be formed as an isolated p-well (IPW) that is used with I/O designs to provide noise isolation between the VSS and VSS_BULK buses. As will be appreciated, the p-well 503 may be fully isolated from the P-substrate 501 by providing an n-well ring around the buffer to form an IPW tub. The NMOS output buffer transistor 452 includes a plurality of parallel-connected transistors (e.g., T1, T2,) having a corresponding plurality of gate poly fingers 402-403 formed over the p-well 503. The gated diode 451 is also formed over the p-well 503 with a plurality of parallel-connected diodes (e.g., 521, 522) having a corresponding plurality of diode poly fingers 431, 432. As depicted, the gate and diode poly fingers are positioned to interleave with one another in an alternating pattern of parallel fingers including diode poly fingers laterally adjacent to gate poly fingers. As a result, each gate poly finger (e.g., 402) defines a transistor (e.g., T1) having a first current electrode (e.g., N+ drain region 508 and its associated silicide layer 514) coupled to the I/O pad, a second current electrode (e.g., N+ source region 509 and its associated silicide layer 516) coupled to VSS, and a gate electrode (e.g., gate finger 402 and its associated silicide layer 513) coupled to receive predriver signal PD.N. Similarly, each diode poly finger (e.g., 431) defines a diode (e.g., D2) having a first current electrode (e.g., N+ drain region 510 and its associated silicide layer 518) coupled to I/O and a second current electrode (e.g., P+ body region 507 and its associated silicide layer 519) coupled to VSS, thereby defining a lateral diode from the P-N junctions between the p-type region (e.g., p-well 503) and the n-type region (e.g., the N+ drain region 510). Again, the diode poly fingers are shown as floating elements, but they may be connected to a reference voltage (e.g., VSS) or any other signal line if desired to control or alter the electrical performance of the associated diode. In selected embodiments, the source and body terminals of NMOS output buffer transistor 452 may be electrically isolated from each other. In one example of such embodiment, the P+ body regions (e.g., 507) and its associated silicide layers (e.g. 519) may not be coupled to VSS, as shown in FIG. 5, but to another supply rail, e.g. VSS_BULK, to provide an ESD diode between I/O and VSS_BULK.

In selected embodiments, the NMOS-gated diode combination device 500 may include drain side resistor elements formed in the transistor drain regions for purposes of controlling the current flow through the NMOS output buffer transistor 452 to provide a more uniform turn-on ("snapback") of the plurality of bipolar junction transistor fingers inherent to the multi-finger NMOS output buffer transistor 452 during an ESD event. By way of example, a bipolar junction transistor finger inherent to NMOS T2 comprising gate finger 403 is formed by N+ region 509 ("Emitter"), p-well 503 ("Base"), and N+ region 510 ("Collector"). While resistor elements are not necessarily required, they can be inserted using any of a number of different fabrication techniques. For example, FIG. 4 shows that mask elements 411-417 may be formed over the drain region prior to silicide formation, thereby defining one or more drain-side resistor-protect-oxide (RPO) regions in the substrate below the mask elements 411-417. This use of mask elements is illustrated in FIG. 5 which Shows a plurality of separately patterned mask elements 412-414 formed with patterned oxide layers on the substrate to cover a portion of the N+ drain regions 508, 510, 511 so as to prevent substrate silicide layers 514-520 from being formed where the patterned mask elements 412-414 are located. In particular, a first resistive element is formed in the unsilicided portion of the N+ drain region 508 between the silicide layer 514 connected to the I/O terminal and the silicide layer 515 in the N+ drain region 508 that is adjacent to the gate electrode 402. Likewise, a second resistive element is formed in the unsilicided portion of the N+ drain region 510 between the silicide layer 518 connected to the I/O terminal and the silicide layer 517 in the N+ drain region 510 that is adjacent to the gate electrode 403. By positioning the patterned mask elements (e.g., 412, 413, 414) inside each of the N+ drain regions 508, 510, 511, two silicide layers (e.g., 514 and 515) are formed in each drain region, with an adjacent silicide layer (e.g., 515) next to the transistor gate, and an I/O terminal silicide layer (e.g., 514) separated from the silicide layer 515 next to the transistor gate.

As will be appreciated, the width of the unsilicided portions of the N+ drain regions may be adjusted and controlled to increase or decrease the values of the inserted drain side resistor elements, thereby decreasing or increasing the current flow through the NMOS output buffer transistor 452. In selected embodiments, the drain side resistor elements are effectively removed by not using mask elements 411-417 in the fabrication process. In other embodiments, the length of mask elements 411-417 can be extended over the transistor gates towards the source regions to further increase the resistance values associated with each transistor. In devices where the mask element overlaps the drain and gate elements, superior snapback performance of the inherent bipolar junction transistor may be obtained since omitting the silicide layers (e.g., 515, 517) adjacent to the transistor gate (e.g., 402) may enhance uniform turn-on along the entire transistor finger ("micro ballasting" of the transistor). However, there may be design benefits associated with retaining a narrow silicide layer (e.g., 515) between the gate (e.g., 402) and the RPO (412) because the MOSFET transistor and the RPO resistor can be treated as two separate devices in the design schematic and netlist. Typically, a drain ballasted MOSFET device where the RPO mask element overlaps the drain and gate elements cannot be treated simply as a combination of a MOSFET transistor and a series RPO resistor. Dedicated design kit support with regards to layout versus schematic (LVS) checks, layout design rule checks (DRC), and compact modeling to describe the electrical behavior of such a device would be required.

Figure 6:
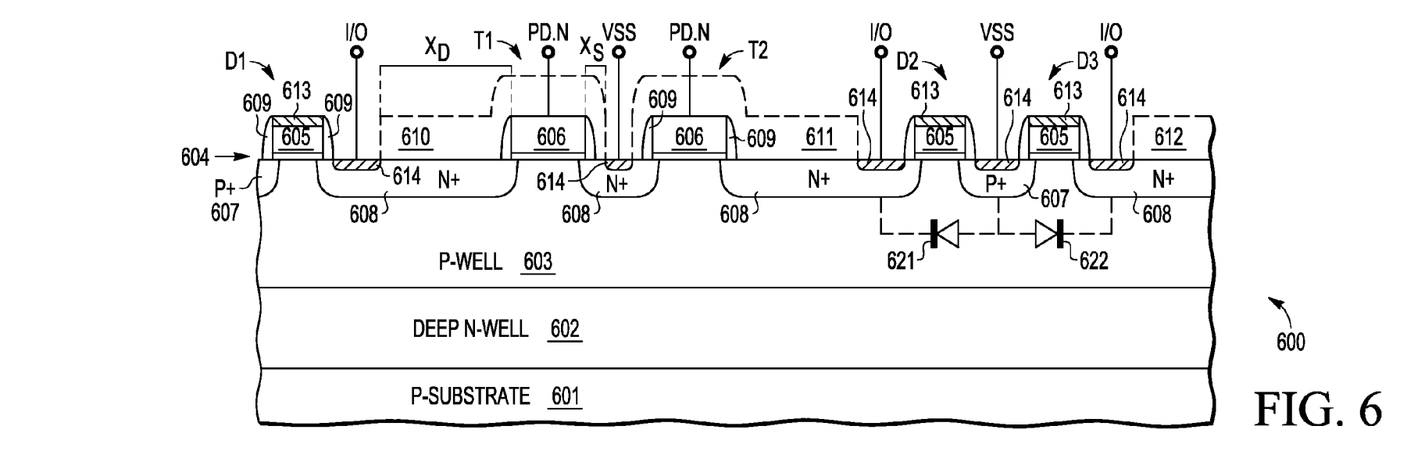
FIG. 6 shows a partial cross-sectional view of an NMOS-gated diode combination device with a first alternate RPO mask defining a drain and source side resistor regions.

This use of larger RPO mask elements is illustrated in FIG. 6 which shows a partial cross-sectional view of an NMOS-gated diode combination device 600 with a plurality of separately patterned mask elements 610-612 formed in accordance with an alternate RPO mask defining drain and source side resistor regions. After forming a p-well 603 in a deep n-well 602 in the p-substrate 601 and defining patterned gate electrodes 606 with implanted P+ and N+ regions 607, 608 and sidewall spacers 609, the alternate RPO mask elements 610-612 are formed to define resistive elements in unsilicided portions of the N+ source and drain regions 608 of each transistor (e.g., T1). In the fabrication sequence, the patterned mask elements (e.g., 610) are formed prior to silicidation in order to cover part of the N+ drain region, all of the gate layer 606, and part of the N+ source region 608, but as indicated by the dashed lines, the mask elements 610-612 may be removed prior to formation of the electrode contact layers so that the I/O, predriver and VSS lines can be connected to the NMOS-gated diode combination device, with or without contact silicide layers being formed. This use of the patterned mask elements 610-612 at this stage of device fabrication prevents substrate silicide layers 614 from being formed where the patterned mask elements 610-612 are located. As a result, a first series-connected resistive element is formed in the unsilicided portion of the N+ drain region 608 between the silicide layer 614 connected to the I/O terminal and the gate electrode 606, a second series-connected resistive element is formed in the unsilicided gate electrode 606, and a third series-connected resistive element is formed in the unsilicided portion of the N+ source region 608 between the silicide layer 614 connected to the VSS terminal and the gate electrode 606. However, the placement of the patterned mask elements 610-612 may be controlled so that the lateral gated diodes 621, 622 are not affected.

Figure 7:
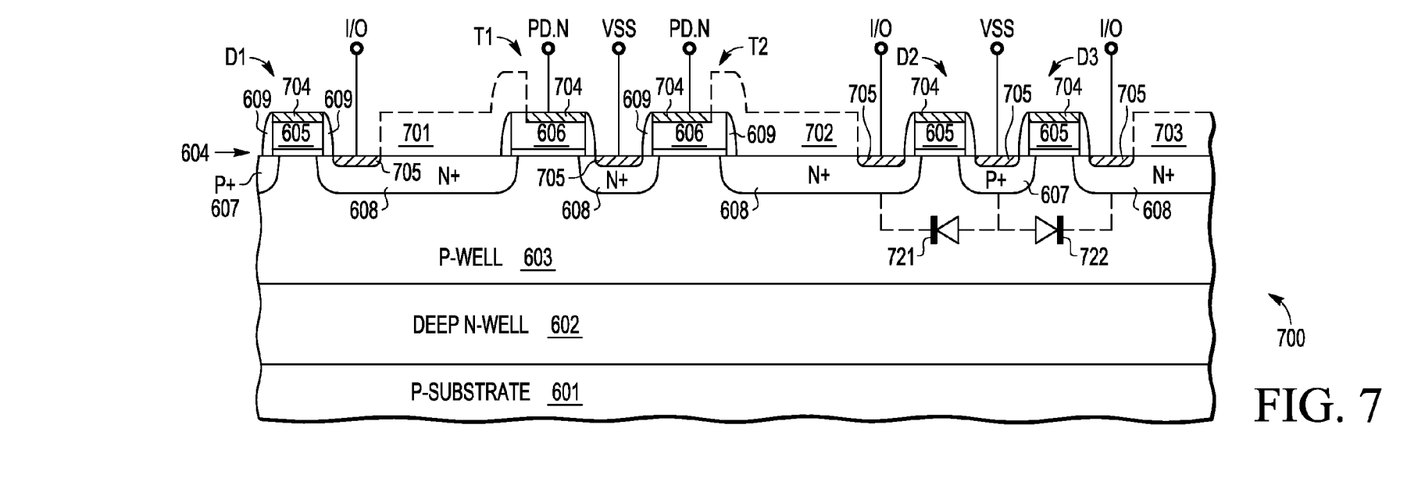
FIG. 7 shows a partial cross-sectional view of an NMOS-gated diode combination device with a second alternate RPO mask defining a drain side resistor region.

Yet another example of using patterned mask elements to define resistance elements is shown in FIG. 7 which shows a partial cross-sectional view of an NMOS-gated diode combination device 700 with a plurality of separately patterned mask elements 701-703 formed in accordance with an alternate RPO mask defining drain side resistor regions. As with FIG. 6, the alternate RPO mask elements 701-703 are formed over the p-well 603 (and underlying n-well 602 and p-substrate 601) and patterned gate electrodes 606 with sidewall spacers 609 to cover part of the implanted N+ drain regions 608 and part of the gate electrode 606 to define resistive elements in unsilicided portions of the N+ drain regions 608 and gate electrode 606 of each transistor (e.g., T1). To this end, the patterned mask elements (e.g., 701) are formed prior to silicidation in order to cover part of the N+ drain region and part of the gate layer 606. As indicated by the dashed lines, the mask elements 701-703 may be removed prior to formation of the electrode contact layers so that the I/O, predriver and VSS lines can be connected to the NMOS-gated diode combination device, with or without contact silicide layers being formed. This use of the patterned mask elements 701-703 at this stage of device fabrication prevents the gate silicide layers 704 and substrate silicide layers 705 from being formed where the patterned mask elements 701-703 are located, thereby forming a first series-connected resistive element in the unsilicided portion of the N+ drain region 608 between the silicide layer 705 connected to the I/O terminal and the gate electrode 606. In addition, a second series-connected resistive element is formed in the gate electrode 606 where the gate silicide layer 704 is not located. Again, the placement of the patterned mask elements 701-703 may be controlled so that the lateral gated diodes 721, 722 are not affected.

The extent of the drain coverage by the patterned mask elements is defined by a drain coverage dimension $X_D$, and the extent of the source coverage is defined by a source coverage dimension $X_S$. As will be appreciated, the minimum coverage of a source or drain region will be limited by the minimum design rule for any given fabrication process, but should be controlled to allow the subsequently formed silicide layers to provide good Ohmic contact to the substrate.

Figure 8:
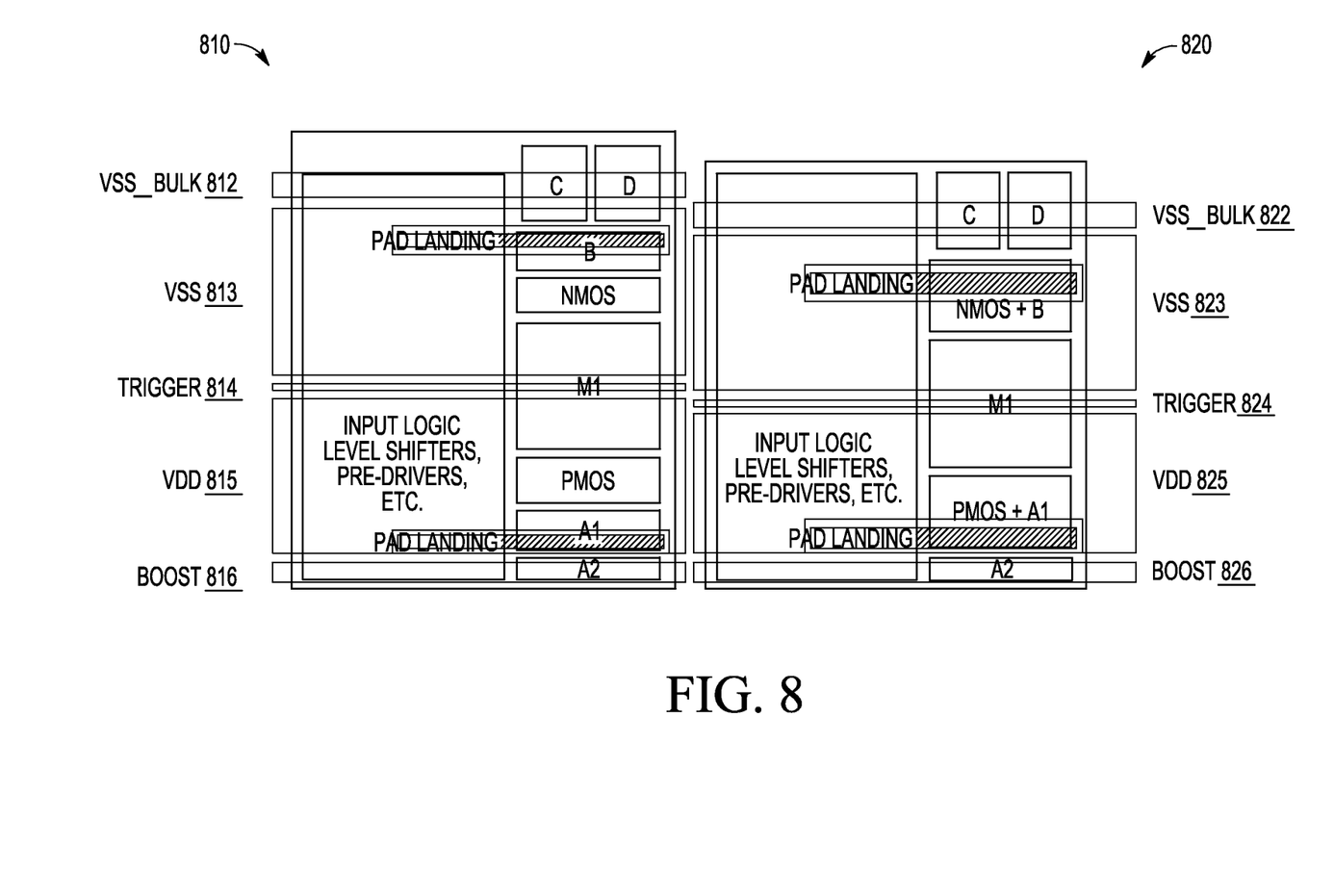
FIG. 8 shows selected layout benefits of interleaving the output buffer and gated diode combination device in accordance with selected embodiments of the present invention.

As disclosed herein, the ESD protection device uses a combined output buffer and gated diode integrated circuit structure having a multi-finger MOSFET device and a multi-finger diode device formed in a shared layout area with alternating source and drain regions separated by gate poly fingers and with body tie regions inserted next to drain regions and isolated therefrom by diode poly fingers to form gated diodes between the drain and body region. The disclosed ESD protection device provides one or more advantages by providing ESD protection circuits with reduced layout area requirements since the output buffer and ESD diode can be formed in a shared layout area instead of in separate areas requiring separate guard ring structures. To illustrate the layout benefits, reference is made to FIG. 8 which shows an integrated circuit layout 810 for implementing the ESD protection circuit of FIG. 1 with conventional output buffer and STI diode structures. As indicated in the layout 810, the component transistor elements (e.g., M1, PMOS, NMOS) and diode elements (e.g., A1, A2, B, C, D) are each formed in separate layout areas and connected to their respective voltage, signal and/or PAD landings (e.g., PAD landings, VSS_BULK 812, VSS 813, TRIGGER 814, VDD 815, and BOOST 816.). In particular, the PMOS output buffer transistors (PMOS) are conventionally formed in separate layout regions from the ESD diodes (A1), and the NMOS output buffer transistors (NMOS) are conventionally formed in separate regions from the ESD diodes (B). However, by forming a combined output buffer and gated diode integrated circuit structure in shared layout area with a multi-finger MOSFET device and a multi-finger diode device, the need for horizontal guard rings between then buffer and diode regions is eliminated. The resulting reduction in layout area requirement is illustrated with the integrated circuit layout 820 for the interleaved output buffer and gated diode combination device where the PMOS output buffer transistors (PMOS) and associated ESD diodes (A1) are formed in the same layout area. In addition or in the alternative, the NMOS output buffer transistors (NMOS) and associated ESD diodes (B) may be formed in the same region. As indicated in the layout 820, the clamp device (M1) and diode elements (e.g., A2, C, D) are each formed in separate layout areas and connected to their respective voltage, signal and/or PAD landings (e.g., PAD landings, VSS_BULK 822, VSS 823, TRIGGER 824, VDD 825, and BOOST 826). However, the PMOS output buffers and ESD diodes A1 are formed in a first shared layout area to be connected to the PAD landing and VSS 823, while the NMOS output buffers and ESD diodes B are formed in a second shared layout area so as to connected to the PAD landing and VDD 825. This approach also eliminates the need for an additional metal layer to jumper the guard rings to connect the buffers to the I/O pad, or alternatively eliminates the requirement of two additional PAD landings for connecting the buffers.

There are also performance benefits that may result from the disclosed ESD protection device, such as improved ESD performance by reducing the effective resistance of the gated ESD diodes as compared to STI diodes. Parasitic metal resistance may also be reduced since the drain metal fingers that are shared between the MOSFET and the gated diode can be made wider compared to standalone diodes. The disclosed ESD protection device also provides a higher failure current as compared to standalone ESD diodes since the diode fingers are spread out over a larger area, thereby reducing the dissipated power density and increasing the thermal failure point due to self-heating during ESD. In addition, the disclosed ESD protection device with gated diodes provides improved performance (high on-conductance, low turn-on delay) as compared to conventional STI diodes that are inherent to the buffer device (drain-body junction), and has reduced susceptibility to latchup compared to a simple perimeter body tie resulting from the additional body tie regions in the disclosed ESD protection device which improve the overall body strapping of the buffer.

Figure 9:
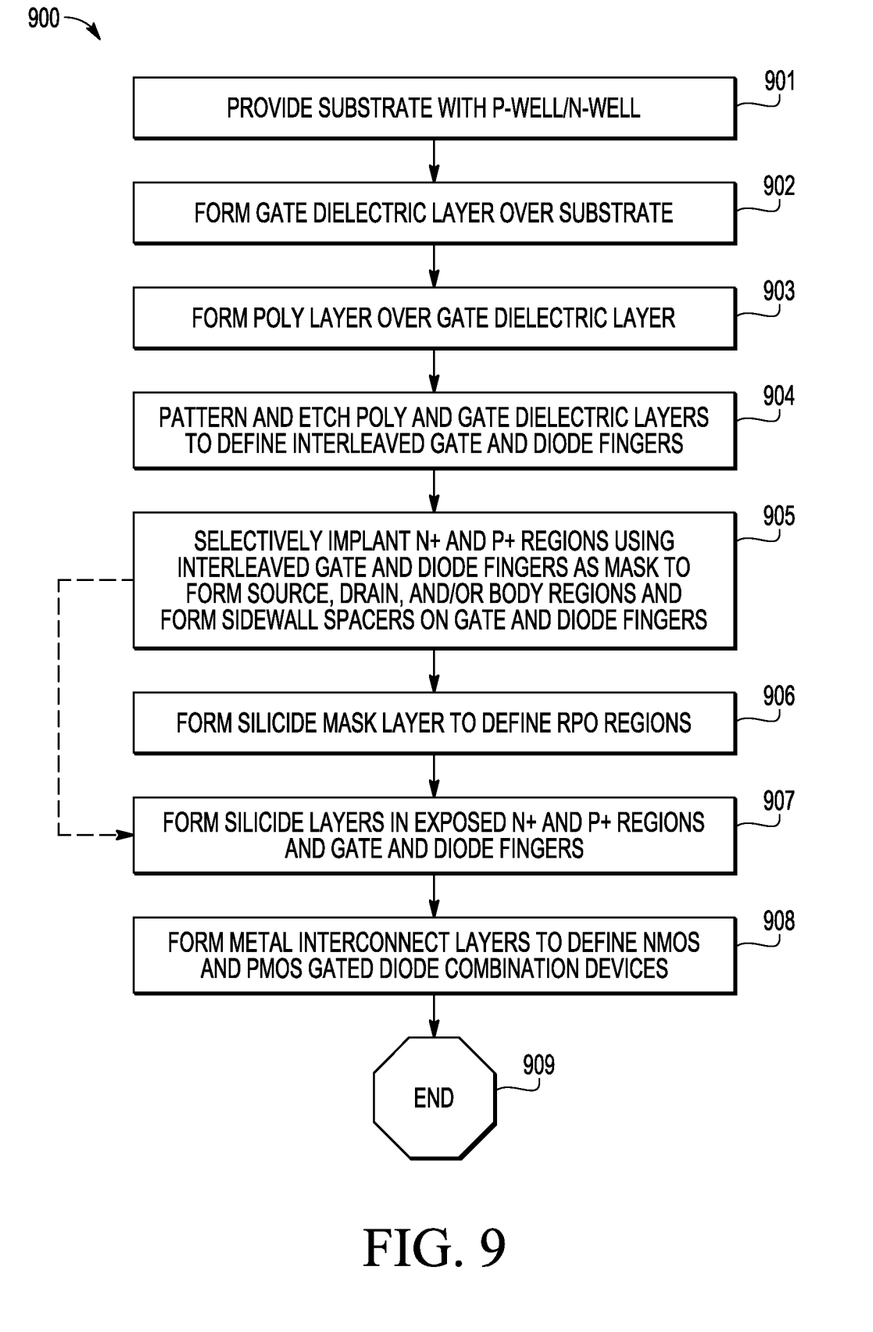
FIG. 9 shows an example process flow for fabricating a combined output buffer and gated diode in accordance with selected embodiments of the present invention.

In accordance with various embodiments of the present invention, an improved ESD protection device is provided by interleaving a multi-fingered output buffer transistor with a multi-fingered gated diode device with diode poly fingers that isolate drain regions from body tie regions in the substrate. While there are a variety of different fabrication processes that can be used to form the disclosed ESD protection device, FIG. 9 shows an example process flow 900 for fabricating a combined output buffer and gated diode in accordance with selected embodiments of the present invention. Though selected embodiments of the fabrication sequence are illustrated in FIG. 9, it will be appreciated that the sequence of illustrated steps may be modified, reduced or augmented in keeping with the disclosure of the present invention. For example, one or more of the steps may optionally be included or excluded. Thus, it will be appreciated that the methodology of the present invention may be thought of as performing the identified sequence of steps in the order depicted in FIG. 9, though the steps may also be performed in parallel, in a different order, or as independent operations that are combined.

As depicted, the methodology begins at step 901 by providing a substrate in which n-wells and/or p-wells are formed, depending on the type of output buffer being fabricated. For example, when forming the PMOS-gated diode combination device 300 shown in FIG. 3, the semiconductor substrate may be formed of a material having first conductivity type impurities, such as a p-type substrate layer 301, at a predetermined P-doping level (e.g., approximately 1E15 cm$^{-3}$), though any desired dopant type and/or concentration may be used. As will be appreciated, the substrate 301 may be formed as a bulk semiconductor substrate, a semiconductor-on-insulator (SOI) type substrate in which one or more additional semiconductor layers and/or well regions are formed using epitaxial semiconductor growth and/or selective doping techniques, or any semiconductor material including, for example, Si, SiC, SiGe, SiGeC, Ge, GaAs, InAs, InP, as well as other III/V or II/VI compound semiconductors or any combination thereof, alone or in combination with an epitaxial layer (e.g., p-type epi layer). Thus, the invention is not limited to any specific substrate type. In the substrate 301, an n-well region 302 may be formed for at least the active PMOS device area. The n-well 302 may be formed of a material having a second conductivity type impurities by using a mask to selectively diffuse or implant n-type impurities into the substrate 301 to a predetermined implant energy and dopant concentration so as to be located at a sufficient depth that will contain the subsequently formed PMOS transistor and gated diode.

At step 902, a gate dielectric is formed over the substrate, followed by formation of a poly layer over the gate dielectric layer (step 903). With reference to the example of FIG. 3, the gate dielectric layer 303 may be formed by depositing or growing an insulator or dielectric (e.g., silicon dioxide, oxynitride, metal-oxide, nitride, etc.) over the semiconductor substrate using chemical vapor deposition (CVD), plasma-enhanced chemical vapor deposition (PECVD), physical vapor deposition (PVD), atomic layer deposition (ALD), thermal oxidation, or any combination(s) of the above.

At step 903, a conductive layer 304 is formed or deposited over the gate dielectric layer using CVD, PECVD, PVD, ALD, or any combination(s) thereof to a predetermined thickness, though other fabrication methods may be used. The conductive layer 304 may be formed with polysilicon or with a doped or undoped amorphous silicon or silicon-germanium layer, though other materials may be used. In addition, the conductive layer 304 may be formed with metal-based layers by depositing one or more metal layers or other conductive materials, alone or in combination with a polysilicon layer, along with more exotic processing, like selective deposition/ epitaxy or direct beam writing.

At step 904, the gate dielectric and poly layers are patterned and selectively etched to define the poly gate layer 210 having a plurality of gate poly fingers 201-213, and separate but interleaved diode poly structures 220, 230, 240, 250, 260 having a plurality of diode poly fingers 221-222, 231-232, 241-242, 251-252, 261-262. As will be appreciated, any desired pattern and etching processes may be used to form the patterned poly gate and diode fingers over the semiconductor substrate, including application and patterning of photoresist on the polysilicon layer 304, though multi-layer masking techniques may also be used. As an alternative to forming gated diode poly structures 220, 230, 240, 250, 260, RPO mask elements may be formed in the same substrate regions as the gated diode poly layers to effectively form a lateral diode junction between implanted drain and body finger regions by avoiding silicidation of the junction of the intended diode.

After forming the patterned poly gate and diode fingers, a plurality of separate implant mask and implantation processes are used (step 905) to form the contact region(s) 305-314, including N+ regions 305-308 and P+ regions 309-314, either before or after forming sidewall spacers 315 on the sidewalls of the patterned poly gate and diode fingers. For example, lightly doped source/drain regions (not shown) may be implanted around the patterned poly gate and diode fingers using one or more mask and implantation steps, followed by formation of sidewall spacers 315 and then implantation of the N+ regions 305-308 and P+ regions 309-314. When forming the sidewall spacers 315, a dielectric layer (e.g., silicon oxide or silicon nitride) may be grown or deposited over the substrate and patterned poly gate and diode fingers. The dielectric layer may then be selectively etched using one or more anisotropic etch processes to form sidewall spacers 315, including a dry etching process (such as reactive-ion etching, ion beam etching, plasma etching, laser etching), a wet etching process (wherein a chemical etchant is employed) or any combination thereof. After forming the sidewall spacers 315, the N+ regions 305, 307 may be formed adjacent to the diode poly fingers by using an implant mask (not shown) to selectively implant n-type impurities into the n-well region 302 to a predetermined depth using a predetermined implant energy and dopant concentration to form body regions for the gate diode. In addition, the N+ diffusion regions 306, 308 may be formed using an implant mask (not shown) to selectively implant n-type impurities adjacent to the intended source regions in the n-well region 302 to form body regions for the diodes (not shown) inherent to each of the transistors T1-T3. In similar fashion, the P+ regions 309-314 may be formed by using an implant mask (not shown) to selectively implant p-type impurities into the n-well region 302 to a predetermined depth using a predetermined implant energy and dopant concentration to form source and drain regions for the PMOS transistor.

At step 906, one or more silicide mask layers may be selectively formed over the substrate to define resistor elements in the ESD protection device. As indicated by the dashed line bypassing step 906, the silicide mask formation step is performed in some embodiments, but provides a way to define resistive elements in unsilicided portions of the substrate and/or gate as desired. With reference to the example of FIGS. 4-5, the patterned mask elements 412-414 may be formed by depositing a layer of nitride or oxide that is selectively patterned and etched to cover predetermined portions of the N+ drain regions 508, 510, 511 so as to prevent substrate silicide layers 514-520 from being formed where the patterned mask elements 412-414 are located.

At step 907, silicide layers may be formed on the appropriate source/drain regions and patterned poly gate and diode fingers. With reference to FIG. 3, the selective formation of silicide is formed by depositing one or more metal layers over the exposed semiconductor substrate and patterned poly gate and diode fingers, such as by using a blanket or sputter deposition process to form a metal layer that will be used to form silicide on the exposed gate and substrate regions, such as the exposed source/drain and body regions. The reaction of the first metal layer and the underlying semiconductor material to form the silicide regions 316-322 is promoted by performing an initial rapid thermal anneal step, followed by a wet clean step to remove the unreacted metal from the dielectric areas (e.g., spacers and trench regions), and then followed by an optional second anneal step. The anneal can be rapid thermal processing, furnace anneal, spike anneal or laser anneal, for example. In selected embodiments, the timing and temperature of the anneal process is controlled to react metal in first metal layer with the underlying polysilicon or other semiconductor material in source/drain regions, but not with the sidewall spacer material 315. After the anneal, any unreacted portion of the first metal layer is selectively removed with an appropriate metal etch, such as a Piranha wet clean process.

At step 908, one or more metallization layer(s) are formed to define terminals for the ESD protection device. With reference to the example of FIG. 3, one or more back-end processing may be used to form electrode contacts to the N+ and P+ 305-314 and silicide regions 316-322 by depositing one or more dielectric or masking layers which are then patterned and selectively etched to define openings over the contact and gate poly regions. In the exposed contact and gate poly regions, one or more conductive layers are deposited, masked and selectively etched to form I/O contacts to the transistor drain regions 309, 312, 313. In addition, VDD contacts are made to the diode body region 307, and also to the body diffusion regions 306, 308 and source regions 310, 311, 314, which are abutted to and shorted with silicide to their respective body regions. Also, predriver signal PD.P contacts are made to the PMOS transistor gates 203, 204, 205.

After completion of the backend processing, the fabrication process ends at step 909.

As described herein, separate standalone ESD diodes (e.g., STI diodes) may be placed in parallel with the lateral inherent gated diodes (e.g., 331, 332 in FIG. 3). In addition, butted source-body tie diodes may be formed by including the body tie regions between the source regions as shown in FIGS. 2-3. However, the lateral inherent gated diodes may, in selected embodiments, serve as the primary or only ESD diodes, conducting a majority of the ESD current. In another embodiment, the boost buss 101 shown in FIG. 1 may be shorted to the VDD bus 102, thereby eliminating the need for A2 diode 112 in FIG. 1 and the A2 diodes in FIG. 8. Further, the lateral parasitic gated diodes may be used for either or both of the pull-up transistor(s) 114 and the pull-down output transistor 122. By using lateral gated diodes inherent to the output buffer transistors as the main ESD protection diodes instead of separate ESD protection diodes, the resulting ESD protection devices provide significantly higher failure current and significantly higher conductivity as compared to, for example, STI bounded diodes with an equal P-N junction perimeter, due primarily to the fact that the ESD current need not flow under any STI, but may flow much less impeded, along the silicon surface. Also, the lateral gated diodes may reduce capacitive loading on the I/O pad because there are no added diffusion regions tied to the pad, as would be the case for separately placed STI diodes.

By now it should be appreciated that there is provided herein an integrated circuit electrostatic discharge (ESD) protection device method and apparatus for connecting a power supply conductor (e.g., VDD or VSS) and conductive pad across a parallel connected output buffer transistor and gated diode. As disclosed, the output buffer transistor is formed in a first layout area with a PMOSFET or NMOSFET gate electrode that is coupled to receive a control signal and that is formed over a substrate with one or more conductive gate fingers. Each gate finger separates a source and drain region of a first conductivity type formed in the substrate. In selected embodiments, the output buffer transistor is formed as a partially silicided drain region defining a drain-side resistive element. The gated diode is formed in the same first layout area as the output buffer transistor with one or more conductive diode fingers and a corresponding one or more body tie regions of a second conductivity type formed in the substrate. As formed, each body tie region is separated or isolated from a corresponding drain region from the output buffer transistor by a conductive diode finger. In selected embodiments where the output buffer transistor is implemented as a plurality of parallel connected butted source-body tie output buffer transistors, the plurality of conductive gate fingers may extend perpendicularly from a single conductive gate spine, and the gated diode may be implemented as a plurality of parallel connected diodes defined by the plurality of conductive diode fingers which are interleaved with and parallel to the plurality of conductive gate fingers, wherein each of the plurality of parallel connected diodes comprises a gated diode inherent to the output buffer transistor for conducting ESD current. Thus, the gated diode may be formed by a P-N junction between a well of a first conductivity type (e.g., n-type) and a diffusion region of a second conductivity type (e.g., p-type) that functions as a drain of the output buffer transistor.

In another form, there is provided an integrated circuit device and method for making same. The IC device includes a first conductor (e.g., pad conductor), a second conductor (e.g., power supply conductor), a third conductor (e.g., a power supply conductor), and a MOSFET transistor that is formed in a substrate region of a first conductivity type. As formed, the transistor includes a gate electrode and source and drain regions of a second conductivity type formed in the substrate region, where the drain region is coupled to the first conductor, the source region is coupled to the third conductor, the substrate region is coupled to the second conductor, and the gate electrode is formed over the substrate region with a conductive gate layer which separates the source and drain regions. The IC device also includes a diode formed in the same substrate region as the MOSFET transistor and coupled between the first and second conductors. The diode is formed from a body tie region of the first conductivity type formed in the substrate and the MOSFET transistor drain region of the second conductivity type, where a diode finger layer is formed over the substrate region in parallel with the gate layer to separate the body tie region and MOSFET transistor drain region. In selected embodiments, the conductive gate layer is formed as a plurality of conductive gate fingers extending perpendicularly from a single conductive gate spine, and the diode layer is formed as a plurality of conductive diode fingers which are interleaved with and parallel to the plurality of conductive gate fingers. In other embodiments, the diode layer is formed from a dielectric layer, a polysilicon layer, one or more metal layers, or a resistor-protect-oxide (RPO) layer. In addition, a metal-based contact layer may be formed on the MOSFET transistor drain region that is shared between the MOSFET transistor and diode and that is connected to an input and/or output pad.

In yet another form, there is provided a semiconductor device and process for forming same. In the disclosed process, a semiconductor substrate is provided, a first well region of a first conductivity type is formed in the semiconductor substrate, and a patterned gate electrode finger layer and patterned diode finger layer are formed over at least part of the first well region. In addition, source and drain regions of a second opposite conductivity type are formed in the first well region and adjacent to the patterned gate electrode finger, thereby defining an output buffer transistor. There is also formed a body tie region of the first conductivity type in the first well region and adjacent to the patterned diode finger layer, thereby defining a gated diode between the body tie region and the drain region such that the gated diode is coupled in parallel with the output buffer transistor. Finally, one or more conductive layers are formed to connect the body tie region to a power supply conductor and to connect the drain region to a conductive pad. The formation of conductive layers may include forming a silicide layer to partially cover the drain region, thereby defining a drain-side resistive element.

Although the described exemplary embodiments disclosed herein are directed to an ESD protection device and associated method of manufacture in which an output buffer transistor with a multi-fingered gated diode device is interleaved with diode poly fingers that isolate drain regions from body tie regions in the substrate, the present invention is not necessarily limited to the example embodiments which illustrate inventive aspects of the present invention that are applicable to a wide variety of integrated ESD protection circuits with combined output buffer and gated diode. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover anon-exclusive inclusion, such that a process, method, article, or apparatus that comprises a list of elements does not include only those elements but may include other elements not expressly listed or inherent to such process, method, article, or apparatus.

What is claimed is:

1. An integrated circuit electrostatic discharge (ESD) protection device comprising:
a power supply conductor;
a conductive pad;
an output buffer transistor formed in a first layout area and electrically coupled between the power supply conductor and the conductive pad, the output buffer transistor comprising a MOSFET gate electrode coupled to receive a control signal and formed over a substrate with a conductive gate finger which separates a source region and a drain region of a first conductivity type formed in the substrate; and
a gated diode formed in the same first layout area as the output buffer transistor and electrically connected as an ESD diode between the power supply conductor and the conductive pad, the gated diode comprising the drain region that is electrically connected to the conductive pad and a corresponding body tie region of a second conductivity type that is formed in the substrate and that is electrically connected to the power supply conductor such that the body tie region is separated from the drain region of the output buffer transistor by a diode finger formed over the substrate that is not electrically connected to the conductive gate finger of the output buffer transistor, where a mask element formed on the drain region separates a first silicide region adjacent the conductive gate finger from a second silicide region adjacent the diode finger, where the diode finger is one of a plurality of U-shaped conductive diode fingers, each formed with a single continuous first conductor layer and interleaved with and parallel to the conductive gate finger formed with a single continuous second conductor layer that is separate from the first conductor layer.

2. The integrated circuit ESD protection device of claim 1, where the output buffer transistor comprises an NMOS transistor coupled between a VSS power supply conductor and the conductive pad.

3. The integrated circuit ESD protection device of claim 1, where the drain region of the output buffer transistor comprises a drain-side resistive element.

4. The integrated circuit ESD protection device of claim 1, wherein the gated diode is implemented as a plurality of parallel connected diodes defined by the plurality of diode fingers, wherein each of the plurality of parallel connected diodes comprises a gated diode inherent to the output buffer transistor for conducting ESD current.

5. The integrated circuit ESD protection device of claim 1, wherein the gated diode is formed by a P-N junction between a P-well and an N+ diffusion region that functions as the drain of the output buffer transistor.

6. The integrated circuit ESD protection device of claim 1, where the MOSFET gate electrode comprises a multi-fingered MOSFET gate electrode formed with a plurality of conductive gate fingers.

7. The integrated circuit ESD protection device of claim 1, where the substrate is electrically coupled to the power supply conductor.

8. An integrated circuit device comprising:
a first pad conductor;
a power supply conductor;
a MOSFET transistor formed in a substrate region of a first conductivity type, the transistor comprising a gate electrode and source and drain regions of a second conductivity type formed in the substrate region, where the drain region is electrically coupled to the first pad conductor, the substrate region is electrically coupled to the power supply conductor, and the gate electrode is formed over the substrate region with a conductive gate finger which separates the source and drain regions; and
a gated diode structure formed in the same substrate region as the MOSFET transistor and electrically connected as an ESD diode between the first pad conductor and power supply conductor, the gated diode structure comprising:
a body tie region of the first conductivity type formed in the substrate region that is electrically connected to the power supply conductor,
the MOSFET transistor drain region of the second conductivity type that is electrically connected to the first pad conductor, and
a diode finger formed over the substrate region in parallel with the conductive gate finger to separate the body tie region and MOSFET transistor drain region, where a mask element formed on the MOSFET transistor drain region separates a first silicide region adjacent the conductive gate finger from a second silicide region adjacent the diode finger, where the diode finger is one of a plurality of U-shaped conductive diode fingers, each formed with a single continuous first conductor layer and interleaved with and parallel to the conductive gate finger formed with a single continuous second conductor layer that is separate from the first conductor layer.

9. The integrated circuit device of claim 8, where the first pad conductor comprises an input/output pad conductor.

10. The integrated circuit device of claim 8, where the power supply conductor is electrically connected to a power supply.

11. The integrated circuit device of claim 8, where the MOSFET transistor comprises an NMOS transistor coupled between a VSS power supply conductor and the first pad conductor.

12. The integrated circuit device of claim 8, where the drain region of the MOSFET transistor comprises a drain-side resistive element.

13. The integrated circuit device of claim 8, where the conductive gate finger is one of a plurality of conductive gate fingers electrically coupled together and located in parallel.

14. The integrated circuit device of claim 8, where the diode finger comprises a dielectric layer, a polysilicon layer, one or more metal layers, or a resistor-protect-oxide (RPO) layer.

15. The integrated circuit device of claim 8, further comprising a metal-based contact layer formed on the MOSFET transistor drain region that is shared between the MOSFET transistor and gated diode structure and that is connected to the first pad conductor.

16. A method for forming a semiconductor device comprising:
    forming a first well region of a first conductivity type in a first semiconductor substrate;
    forming a patterned gate electrode finger layer and a separate floating patterned diode finger layer over at least part of the first well region, where the separate floating patterned diode finger is one of a plurality of U-shaped conductive diode finger layers, each formed with a single continuous first conductor layer and interleaved with and parallel to the patterned gate electrode finger layer formed with a single continuous second conductor layer that is separate from the first conductor layer;
    forming source and drain regions of a second opposite conductivity type in the first well region and adjacent to the patterned gate electrode finger layer, thereby defining an output buffer MOSFET transistor;
    forming a mask element over a shared drain region between the patterned gate electrode finger layer and the separate floating patterned diode finger layer;
    forming a body tie region of the first conductivity type in the first well region and adjacent to the patterned diode finger layer, thereby defining a gated diode between the body tie region and the shared drain region such that the gated diode is coupled in parallel with the output buffer MOSFET transistor; and
    forming one or more conductive layers to connect the body tie region to a power supply conductor and to connect the shared drain region to a conductive pad so that the gated diode is electrically connected as an ESD diode between the power supply conductor and the conductive pad.

17. The method of claim 16, where forming one or more conductive layers comprises forming a silicide layer to partially cover the shared drain region except where covered by the mask element, thereby defining a drain-side resistive element.

\* \* \* \* \*